(12) United States Patent
Chen (10) Patent No.: US 8,324,690 B2
(45) Date of Patent: Dec. 4, 2012

(54) SEMICONDUCTOR DEVICE WITH MULTI-FUNCTIONAL DIELECTRIC LAYER

(75) Inventor: Jyh-Huei Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 60 days.

(21) Appl. No.: 12/861,642

(22) Filed: Aug. 23, 2010

(65) Prior Publication Data

US 2010/0320465 A1 Dec. 23, 2010

Related U.S. Application Data

(63) Continuation of application No. 11/758,897, filed on Jun. 6, 2007, now Pat. No. 7,785,949.

(51) Int. Cl.
*H01L 29/76* (2006.01)

(52) U.S. Cl. ........ 257/368; 257/384; 257/388; 257/413; 257/635; 257/640; 257/E29.04

(58) Field of Classification Search .................. 438/197, 438/301, 305, 306, 528; 257/E21.619, 368, 257/382–384, 388, 635, 640, E29.04
See application file for complete search history.

(56) References Cited

U.S. PATENT DOCUMENTS

| | | | |
|---|---|---|---|
| 6,040,223 A * | 3/2000 | Liu et al. | 438/303 |
| 6,187,655 B1 * | 2/2001 | Wang et al. | 438/528 |
| 6,326,289 B1 | 12/2001 | Rodder et al. | |
| 6,348,389 B1 | 2/2002 | Chou et al. | |
| 6,569,784 B1 | 5/2003 | Wang et al. | |
| 6,653,191 B1 | 11/2003 | Yang et al. | |
| 6,855,592 B2 | 2/2005 | Lee | |
| 6,989,302 B2 | 1/2006 | Makovicka et al. | |
| 2004/0209432 A1 * | 10/2004 | Ku et al. | 438/301 |
| 2005/0199958 A1 * | 9/2005 | Chen et al. | 257/368 |
| 2006/0228843 A1 * | 10/2006 | Liu et al. | 438/197 |

FOREIGN PATENT DOCUMENTS

CN 1423317 A 6/2003

* cited by examiner

*Primary Examiner* — Michael Trinh
(74) *Attorney, Agent, or Firm* — Duane Morris LLP (57) ABSTRACT

A composite dielectric layer including a tensile stressed nitride layer over an oxide layer serves the dual function of acting as an SMT (stress memorization technique) film while an annealing operation is carried out and then remains partially intact as it is patterned to further serve as an RPO film during a subsequent silicidation process. The composite dielectric layer covers part of a semiconductor substrate that includes a gate structure. The tensile stressed nitride layer protects the oxide layer and alleviates oxide damage during a pre-silicidation PAI (pre-amorphization implant) process. Portions of the gate structure and the semiconductor substrate not covered by the composite dielectric layer include amorphous portions that include the PAI implanted dopant impurities. A silicide material is disposed on the gate structure and portions of the semiconductor substrate not covered by the composite dielectric layer.

19 Claims, 7 Drawing Sheets

SEMICONDUCTOR DEVICE WITH MULTI-FUNCTIONAL DIELECTRIC LAYER

RELATED APPLICATION

This application claims priority to, and is a continuation application of U.S. patent application Ser. No. 11/758,897 filed on Jun. 6, 2007, entitled METHOD FOR FORMING SEMICONDUCTOR DEVICE USING MULTI-FUNCTIONAL SACRIFICIAL DIELECTRIC LAYER, the contents of which are hereby incorporated by reference as if set forth in their entirety.

TECHNICAL FIELD

The present disclosure relates, most generally, to semiconductor devices and methods for manufacturing the same. More particularly, the present disclosure relates to a semiconductor device structure in which the same sacrificial dielectric layer is used during an annealing operation and as a resist protect dielectric during a subsequent silicidation process and the device formed using this structure.

BACKGROUND

In today's semiconductor manufacturing industry, it is critical to produce devices as rapidly as possible and as inexpensively as possible. A corollary to this is that it would be advantageous to produce any particular semiconductor device with a process fabrication sequence that involves the fewest number of processing operations and using the least amount of processing materials. It would clearly be advantageous to produce semiconductor devices with the same functionality, the same yield, and of the same quality, using a reduced number of processing operations and fewer processing materials.

According to conventional technology, when a semiconductor structure such as a transistor is annealed, a dielectric layer of one or more dielectric materials is maintained intact during the annealing process. The dielectric layer may serve as a stress memorization layer. This dielectric layer is then removed and a further dielectric is formed to use as a RPO (resist protect oxide) layer. The RPO is commonly formed over various structures and regions to protect the same during subsequent processing operations performed on the other structures and regions of the semiconductor substrate. The RPO may be patterned to expose portions of the underlying structures to be silicided, while protecting other portions from silicide formation during the subsequent silicidation process. This represents an area in which it would be beneficial to reduce the number of process operations and materials used. The present disclosure addresses this concern.

Another shortcoming associated with semiconductor manufacturing is related to the PIA (pre-amorphization implant)/silicidation process sequence. Conventionally, when an RPO oxide is formed and patterned prior to a silicidation process, the RPO oxide film becomes undesirably damaged during the pre-amorphization implant (PAI) advantageously used to amorphize exposed silicon surfaces prior to silicidation and while the RPO oxide is still in place. The RPO oxide damaged by the pre-silicidation PAI, is then undesirably attacked and removed by the conventionally-used pre-silicidation HF dip. This can cause silicide spikes in undesired areas especially when low activation energy metals such as nickel are used, and represents a further shortcoming in semiconductor manufacturing.

SUMMARY OF THE DISCLOSURE

To address these and other needs and in view of its purposes, provided is a semiconductor device comprising a semiconductor substrate, a gate structure disposed over the semiconductor substrate, and a dielectric material disposed over portions of the semiconductor substrate and comprising a composite layer of a silicon nitride layer over an oxide layer, the silicon nitride layer having a tensile stress. A channel is disposed beneath the gate structure and includes a tensile stress therein, and a silicide material is disposed on the gate structure and on further portions of the semiconductor substrate not covered by the dielectric material According to another aspect, provided is a semiconductor device comprising a semiconductor substrate, a gate structure disposed over the semiconductor substrate, the gate structure including a silicon gate layer, and a dielectric material comprising a composite layer of dielectric films, at least one of the dielectric films including a tensile stress and the dielectric material disposed over portions of the semiconductor substrate. A channel is disposed beneath the gate structure and includes a tensile stress therein. The gate structure and further portions of the semiconductor substrate over which the dielectric material is not disposed, are at least partially amorphous in nature and a silicide material is disposed on the gate structure and on the further portions of the semiconductor substrate.

According to another aspect, the disclosure provides a semiconductor device comprising a semiconductor substrate, a gate structure disposed over the semiconductor substrate and including a silicon gate electrode, and a dielectric material disposed over portions of the semiconductor substrate and comprising a composite layer of a silicon nitride layer over an oxide layer, the silicon nitride layer having a tensile stress. The silicon gate electrode and further portions of the semiconductor substrate not covered by the dielectric material each include at least partially amorphous sections. The semiconductor device further comprises a channel disposed beneath the gate structure and including a tensile stress therein, and a silicide material disposed on the at least partially amorphous sections of the silicon gate electrode and on the further portions of the semiconductor substrate not covered by the dielectric material. The further portions of the semiconductor substrate comprise source/drain regions and the silicon gate electrode and the further portions of the semiconductor substrate include therein at least a dopant impurity at an impurity level of about 1E13 atoms/cm2. The dopant impurity comprises at least one of argon, gallium, indium, germanium, and thallium.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
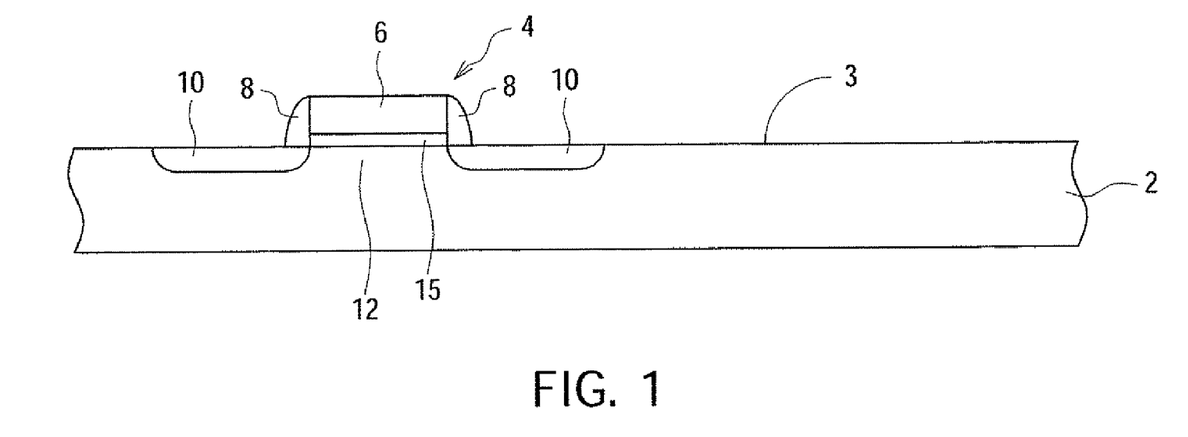
FIGS. 1-8 are cross-sectional views illustrating an exemplary sequence of processing operations according to one exemplary embodiment of the disclosure.

FIG. 1 is a cross-sectional view showing semiconductor device 4 and substrate 2. Substrate 2 may be a conventional semiconductor substrate such as silicon, gallium arsenide, or other suitable substrates used in the semiconductor manufacturing industry. Substrate 2 includes surface 3. In one exemplary embodiment, semiconductor device 4 may be a transistor such as an NMOS (N-type metal oxide semiconductor) or PMOS (P-type metal oxide semiconductor) transistor but other suitable semiconductor devices may be processed according to aspects of the disclosure, in other exemplary embodiments. In the illustrated embodiment, semiconductor device 4 includes gate electrode 6 formed over gate dielectric 15 formed over channel region 12. Gate electrode 6 may advantageously be formed of polysilicon or other suitable materials. Semiconductor device 4 additionally includes source/drain regions 10 disposed adjacent gate electrode 6, and spacers 8. Spacers 8 may be formed of a single material such as an oxide or a nitride or spacers 8 may alternatively represent layers or sections of more than one distinct material such as a combination of an oxide and nitride. Conventional fabrication methods may be used.

Figure 2:
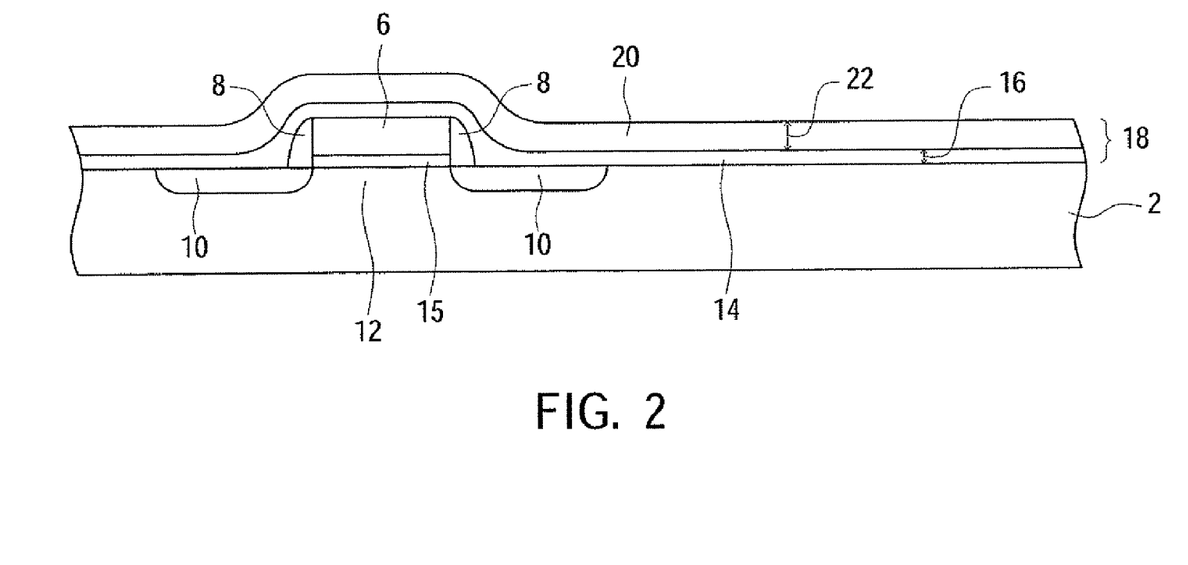

Prior to an annealing operation that will be carried out to anneal source/drain regions 10, composite dielectric layer 18 is formed over substrate 2 and semiconductor device 4 as shown in FIG. 2. Composite dielectric layer 18 includes nitride layer 20 formed over oxide layer 14. Oxide layer 14 may be a silicon dioxide layer formed using CVD, chemical vapor deposition, or other suitable non-thermal oxide formation practices. Oxide layer 14 includes thickness 16 which may be 80 angstroms in one exemplary embodiment, or may range from 40-150 angstroms or have other suitable thicknesses according to other exemplary embodiments. Nitride layer 20 may advantageously be a silicon nitride, SiN, layer and formed using conventional methods. Thickness 22 of nitride layer 20 may include a minimal thickness of about 300 angstroms and may be 500 angstroms according to one advantageous embodiment. Thickness 22 may vary from 300-800 angstroms or have other suitable thicknesses according to other exemplary embodiments. Dielectric layer 18 may advantageously serve as a stress memorization material that remains in place during a subsequent annealing operation. According to one exemplary embodiment in which an SMT, stress memorization technique, is used, nitride layer 20 may be a high-tensile stress nitride layer selectively deposited upon semiconductor device 4 which may be an NMOS transistor with gate electrode 6 formed of polysilicon. The use of nitride layer 20 as a stress memorization material is particularly advantageous in sub-65 nm high performance devices. According to one embodiment, the high-tensile stress nitride layer effects the channel stress beneath gate electrode 6 and the channel stress remains after removal of nitride layer 20. In other exemplary embodiments, oxide layer 14 may represent the stressed film. The stress may be created or enhanced by a subsequent annealing operation. The enhanced strain effect improves transistor performance and, in particular, transistor drive current.

An annealing operation is carried out upon the structure shown in FIG. 2 and, may advantageously be a rapid thermal anneal, RTA, process with a temperature spike within the range of 1000-1200° C. but other suitable annealing parameters may be carried out to anneal source/drain regions 10 in other exemplary embodiments.

Figure 3:
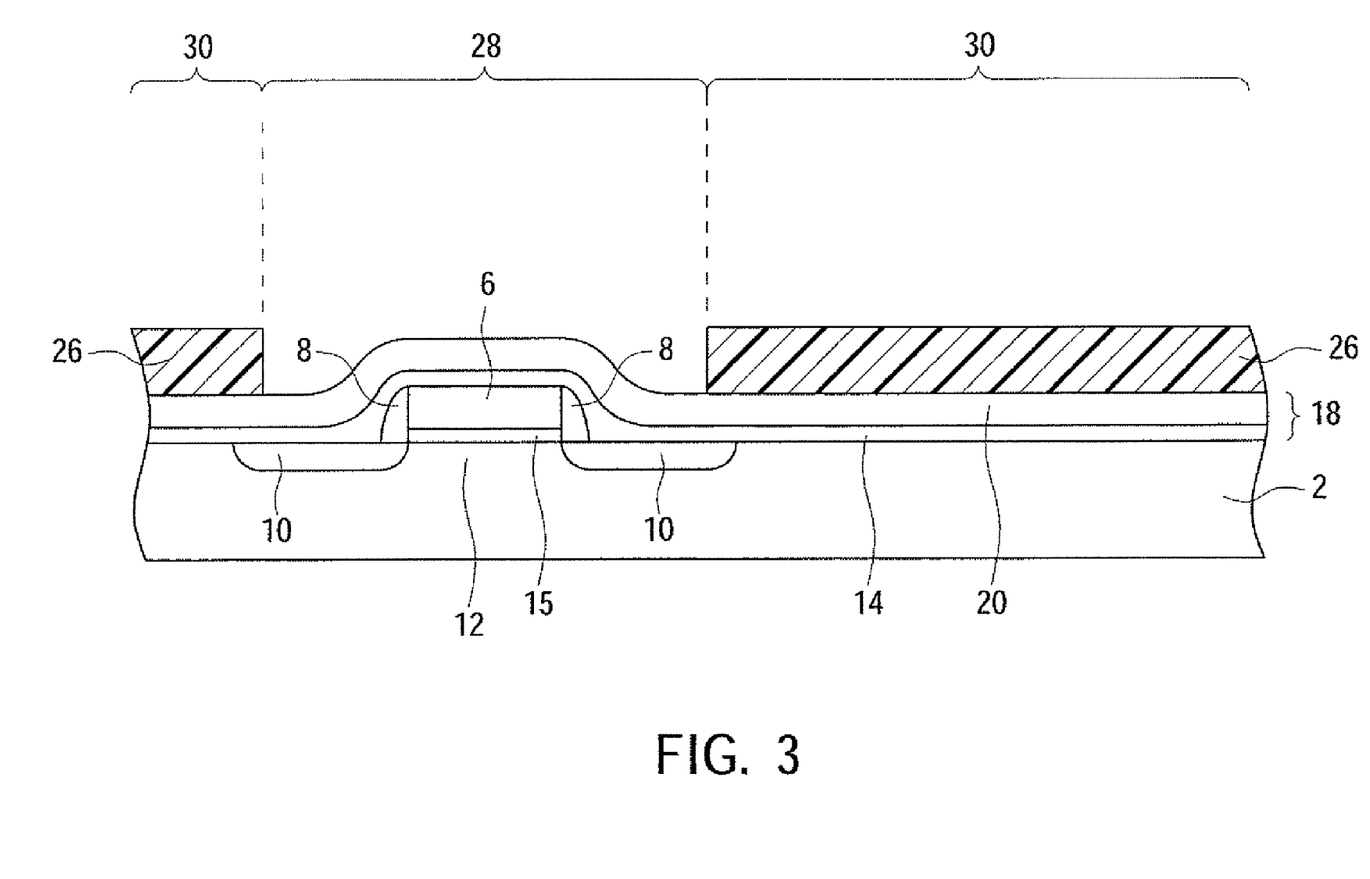
Figure 4:
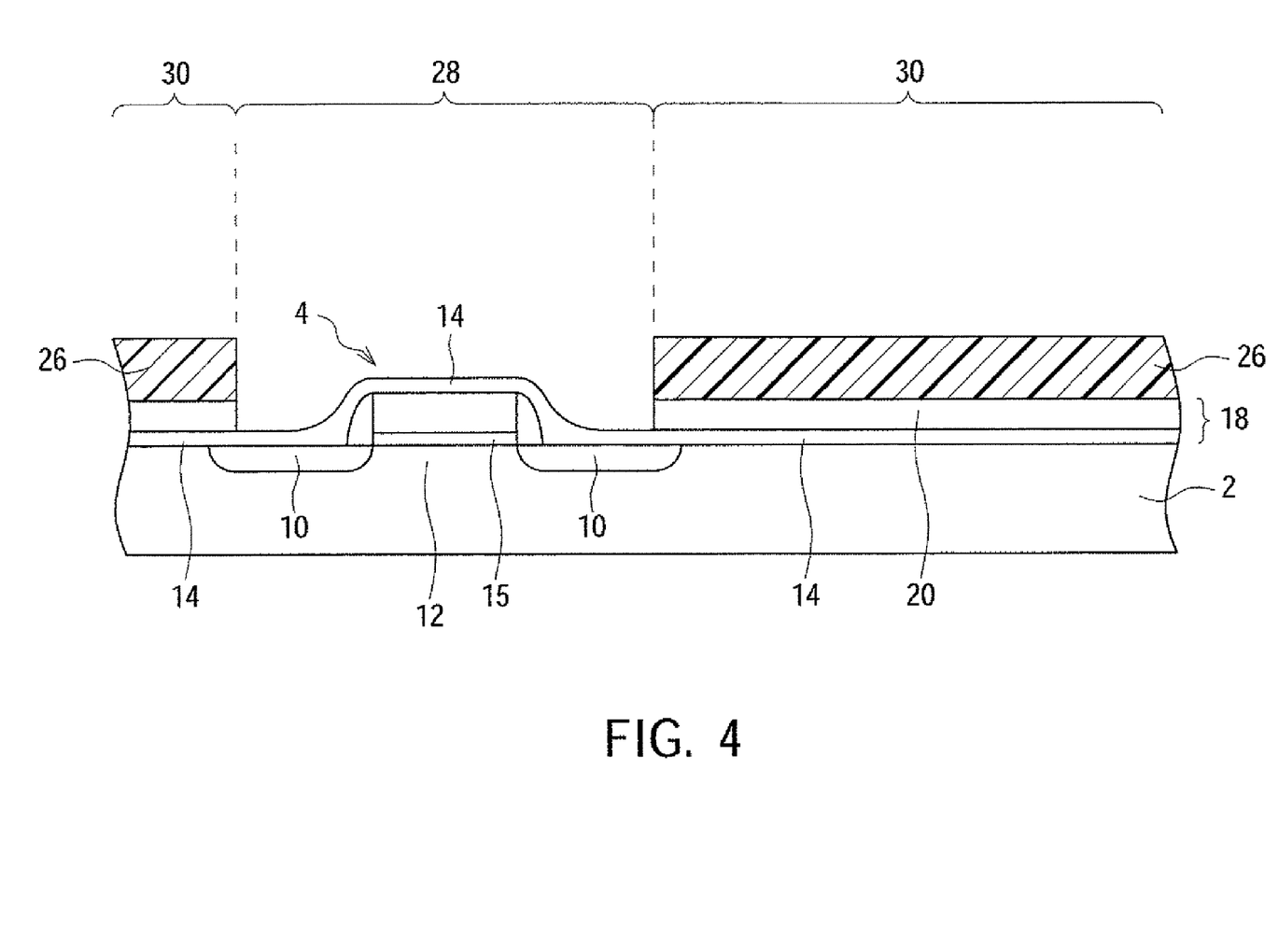

FIG. 3 shows the structure of FIG. 2 after photosensitive layer 26 is formed thereover then patterned to form patterned photosensitive layer 26. Patterned photosensitive layer 26 is present in areas 30 which will be protected during subsequent silicidation processes and photosensitive layer 26 is absent from uncovered area 28 which represents the area within which silicidation will occur. Conventional photoresist materials may be used as photosensitive layer 26 and conventional methods may be used to pattern photosensitive layer 26. FIG. 4 shows the structure in FIG. 3 after an etching operation has been carried out to remove portions of nitride layer 20 from uncovered area 28. In one exemplary embodiment, a dry plasma etching operation may be used and the plasma etching operation may advantageously include an automatic end-pointing technique that automatically terminates the etching operation when nitride layer 20 is completely removed and the subjacent oxide layer 14 is substantially completely exposed. Various plasma etching operations for etching silicon nitride are available in the art.

Figure 5:
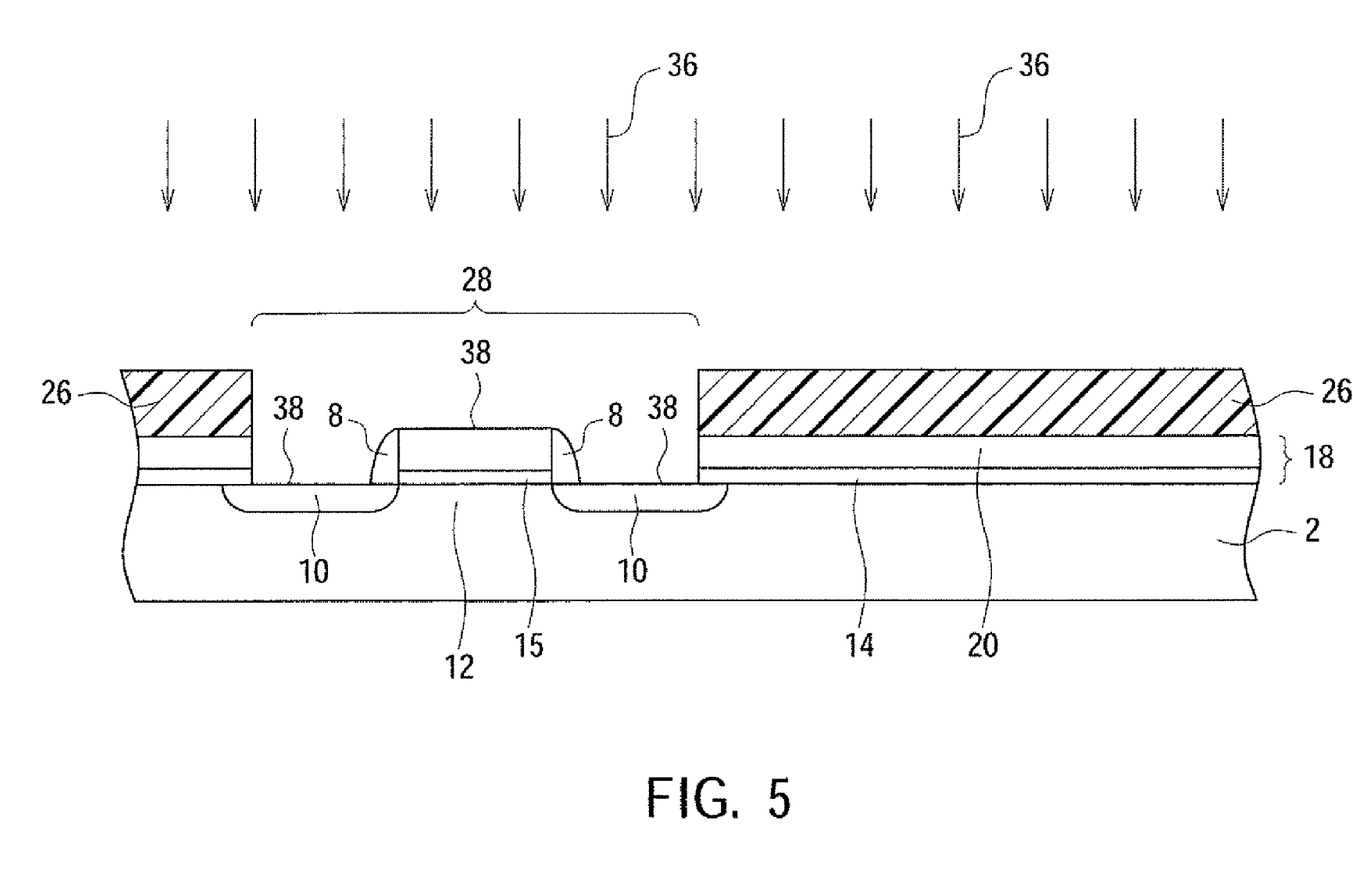

A wet etching operation may be carried out upon the structure shown in FIG. 4, to remove oxide layer 14 from uncovered area 28 and produce the structure shown in FIG. 5. Referring to FIG. 5, both nitride layer 20 and oxide layer 14 are removed from area 28 to expose the underlying structures in uncovered area 28, including silicon surfaces 38. After oxide film 14 is removed from uncovered area 28, a pre-silicidation pre-amorphization implant (PAI) is carried out with dielectric layer 18 still present in areas 30 that are to be protected from silicidation during a subsequent silicidation process. Dielectric layer 18 thus serves as the RPO oxide in this manner. In one exemplary embodiment, photosensitive layer 26 may still be in place during the PAI process and in another exemplary embodiment, patterned photosensitive layer 26 may be completely removed prior to the PAI process. The PAI implant is represented by arrows 36 indicating the introduction of impurities into the illustrated structure. The PAI is a high energy, high dosage implant used to amorphisize exposed silicon surfaces 38 so as to effectuate more complete silicidation during the metal deposition and treating processes that will be carried out subsequently. During the PAI process, an argon gas may be injected into the semiconductor substrate at an energy that may range from 10 KeV to 20 KeV but other high energies may be used in other exemplary embodiments. In other PAI implants, other suitable heavy elements such as Me, As, Gi, In, Ge, Tl or other suitable heavy elements may be used in other exemplary embodiments. The dosage may be at least 1E13 atoms/cm$^2$ but other implant dosages may be used in other exemplary embodiments. The pre-amorphization implant at least partially amorphizes exposed silicon surfaces 38. The presence of nitride layer 20 prevents damage or attack of oxide layer 14 and portions of substrate 2 beneath oxide layer 14, during the high energy PAI process. After the PAI process is complete and photosensitive layer 26 removed, the semiconductor structure including semiconductor device 4 undergoes a pre-silicidation HF dip.

Figure 6:
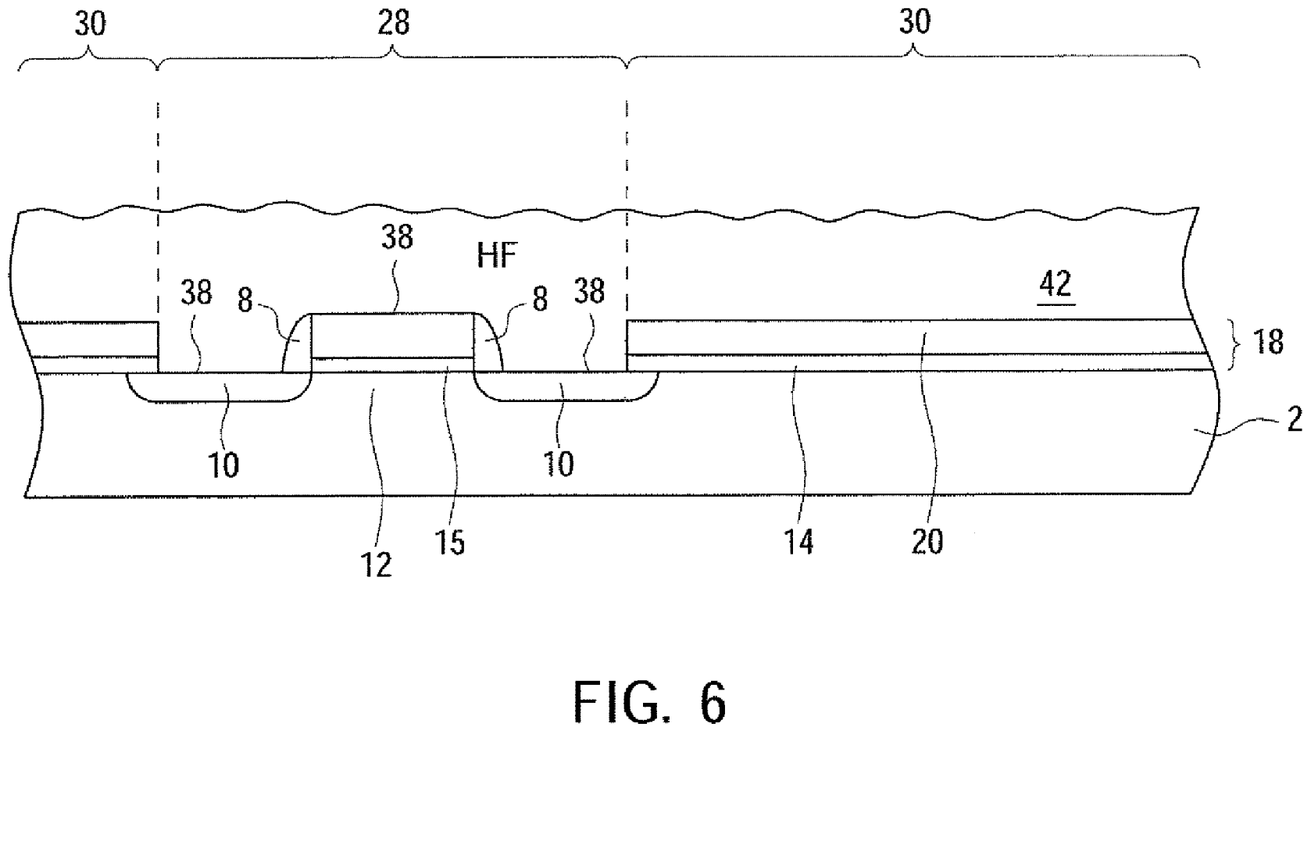

In the pre-silicidation HF dip illustrated in FIG. 6, a liquid hydrofluoric acid solution 42 is contacted to the semiconductor substrate to remove any native oxides that may form, in particular, on exposed silicon surfaces 38. With nitride layer 20 still in place, subjacent oxide layer 14 is not attacked by the HF solution and any potential silicidation in areas 30 is avoided during any subsequent silicidation processes, i.e., silicide spiking through dielectric layer 18 is avoided.

Figure 7:
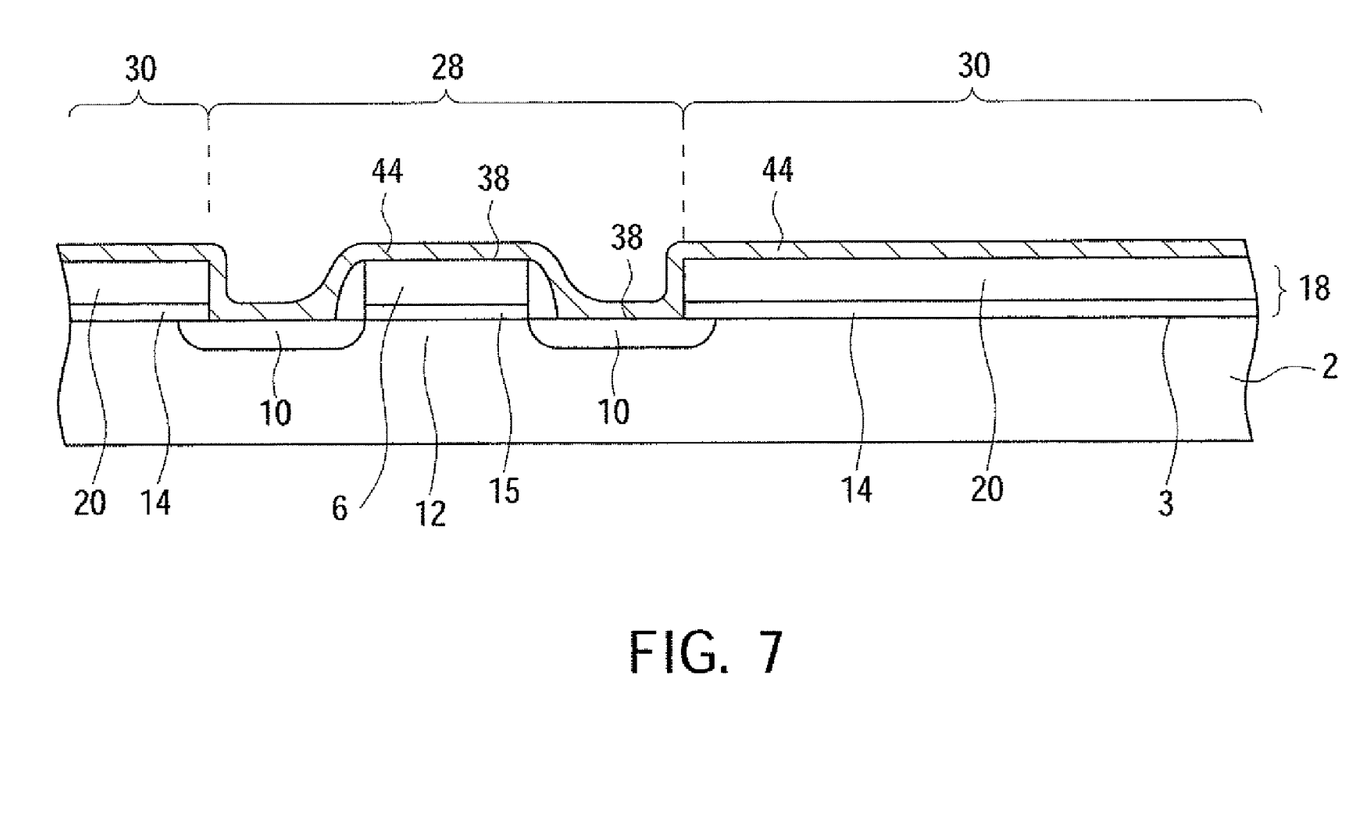

After the "wet" HF dip shown in FIG. 6, metal film 44 is deposited on exposed silicon surfaces 38 within uncovered area 28 and over dielectric layer 18 in areas 30 as shown in FIG. 7. Metal film 44 may be nickel, cobalt, or other suitable metals used to form silicides. Nickel, in particular, requires a low activation energy for forming NiSi. With dielectric layer 18 in place in areas 30, the occurrence of nickel silicide formation through damaged portions of the dielectric layer in areas 30, as would otherwise occur using conventional methods, is avoided according to the method of the disclosure. Using conventional technology, nickel silicide spikes may have occurred through voids formed through the oxide dielectric. The structure in FIG. 7 is heated to a suitable temperature either during or after the deposition of metal film 44, or both, and the portions of metal layer 44 that contact exposed silicon surfaces 38, form silicides therewith. The presence of dielectric layer 18 prevents silicide formation in areas 30 as it isolates metal layer 44 from structures on or in surface 3 during the silicidation process.

Figure 8:
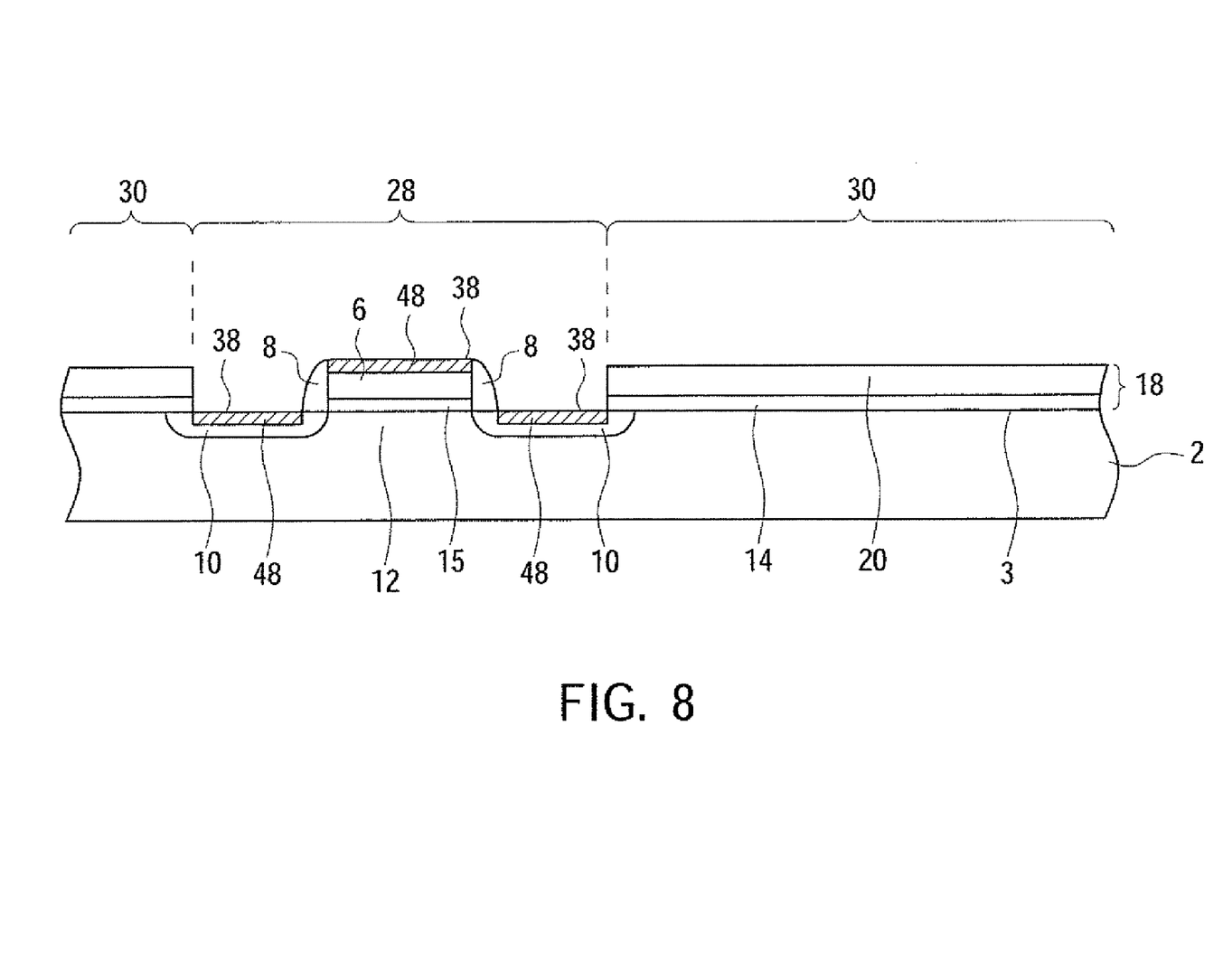

FIG. 8 shows the structure of FIG. 7 after a silicidation process has been carried out to form metal silicides 48 on exposed silicon surfaces 38 in uncovered area 28 and the unreacted portions of metal film 44 removed using conventional methods. Metal silicide 48 represents the combination of metal from metal layer 44 (FIG. 7) with silicon from silicon surface 38. It can be seen that metal silicide 48 forms only on exposed silicon surfaces 38 in uncovered area 28. In other exemplary embodiments, other semiconductor devices and/or portions of semiconductor devices may be alternatively covered with dielectric layer 18 for the prevention of silicides or may be exposed after a pattern is formed of dielectric layer 18. The silicidation technique shown in FIGS. 7-8 in which the portions to be silicided are self-aligned, may be referred to as a silicidation process.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device is formed in a particular orientation.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents.

What is claimed is:

1. A semiconductor device comprising:
a semiconductor substrate;
a gate structure disposed over said semiconductor substrate;
a dielectric material disposed over portions of said semiconductor substrate and comprising a composite layer of a silicon nitride layer over an oxide layer, said silicon nitride layer having a tensile stress;
a channel disposed beneath said gate structure and including a tensile stress therein; and
a silicide material disposed on said gate structure and on further portions of said semiconductor substrate not covered by said dielectric material, wherein said gate structure is at least partially amorphous in nature.

2. The semiconductor device as in claim 1, wherein said further portions of said semiconductor substrate comprise materials that are at least partially amorphous in nature.

3. The semiconductor device as in claim 2, wherein said gate structure and said further portions of said semiconductor substrate include therein at least a dopant impurity at an impurity level of about 1E13 atoms/cm2, and said portions of said semiconductor substrate over which said dielectric material is disposed, does not include said dopant impurity therein.

4. The semiconductor device as in claim 3, wherein said further portions of said semiconductor substrate include source/drain regions and said dopant impurity comprises at least one of argon, gallium, indium, and thallium.

5. The semiconductor device as in claim 1, wherein said gate structure and said further portions of said semiconductor substrate include therein a dopant impurity at an impurity level of about 1E13 atoms/cm2 and comprising at least one of argon, gallium, indium, and thallium.

6. The semiconductor device as in claim 1, wherein said gate structure includes a silicon layer, said silicon layer including a dopant impurity therein, said dopant impurity comprising at least one of argon, gallium, indium, germanium, and thallium.

7. The semiconductor device as in claim 6, wherein said silicon layer includes a portion that is at least partially amorphous in nature and said silicide material is disposed on said silicon layer.

8. The semiconductor device as in claim 1, wherein said silicide material comprises nickel silicide.

9. The semiconductor device as in claim 1, wherein said silicide material comprises cobalt silicide.

10. The semiconductor device as in claim 1, wherein said oxide layer includes a thickness of about 40-150 angstroms and said silicon nitride layer includes a thickness of about 300 to 800 angstroms.

11. A semiconductor device comprising:
a semiconductor substrate;
a gate structure disposed over said semiconductor substrate, said gate structure including a silicon gate layer;
a dielectric material comprising a composite layer of dielectric films, at least one of said dielectric films including a tensile stress, and said dielectric material disposed over portions of said semiconductor substrate;
a channel disposed beneath said gate structure and including a tensile stress therein; and
said gate structure and further portions of said semiconductor substrate over which said dielectric material is not disposed being at least partially amorphous in nature and a silicide material disposed on said gate structure and on said further portions of said semiconductor substrate.

12. The semiconductor device as in claim 11, wherein said gate structure and said further portions of said semiconductor substrate include a dopant impurity therein, said dopant impurity included at an impurity level of about 1E13 atoms/cm2 and comprising at least one of argon, gallium, indium, germanium, and thallium.

13. The semiconductor device as in claim 12, wherein said further portions of said semiconductor substrate comprise source/drain regions.

14. The semiconductor device as in claim 11, wherein said composite layer of dielectric films comprises a silicon nitride layer including a tensile stress, disposed over an oxide layer.

15. The semiconductor device as in claim 11, wherein said composite layer of dielectric films comprises a silicon nitride layer and an oxide layer, said oxide layer including a tensile stress.

16. The semiconductor device as in claim 15, wherein said silicon nitride layer is disposed over said oxide layer.

17. The semiconductor device as in claim 15, wherein said silicide material comprises nickel silicide, said oxide layer includes a thickness of at least 50 angstroms, said silicon nitride layer includes a thickness of about 300 to 800 angstroms and said further portions of said semiconductor substrate include a dopant impurity therein, said dopant impurity included at an impurity level of about 1E13 atoms/cm2 and comprising argon.

18. The semiconductor device as in claim 17, wherein said further portions of said semiconductor substrate comprise source/drain regions and said nickel silicide is disposed on amorphous sections of said further portions of said semiconductor substrate and said gate structure.

19. A semiconductor device comprising:
a semiconductor substrate;
a gate structure disposed over said semiconductor substrate and including a silicon gate electrode;
a dielectric material disposed over portions of said semiconductor substrate and comprising a composite layer of a silicon nitride layer over an oxide layer, said silicon nitride layer having a tensile stress,
said silicon gate electrode and further portions of said semiconductor substrate not covered by said dielectric material each including at least partially amorphous sections;
a channel disposed beneath said gate structure and including a tensile stress therein; and
a silicide material disposed on said at least partially amorphous sections of said silicon gate electrode and said further portions of said semiconductor substrate not covered by said dielectric material,
wherein said further portions of said semiconductor substrate comprise source/drain regions and said silicon gate electrode and said further portions of said semiconductor substrate include therein at least a dopant impurity at an impurity level of about 1E13 atoms/cm2 and said dopant impurity comprises at least one of argon, gallium, indium, germanium, and thallium.

* * * * *